United States Patent
Storer et al.

(10) Patent No.: US 9,682,585 B2
(45) Date of Patent: Jun. 20, 2017

(54) AUTOMATIC FILM WASHOUT SYSTEM

(71) Applicant: Media Blast & Abrasives, Inc., Brea, CA (US)

(72) Inventors: Ron Storer, Villa Park, CA (US); Robert A. Robinson, Glenwood, NM (US)

(73) Assignee: Media Blast & Abrasives, Inc., Brea, CA (US)

( * ) Notice: Subject to any disclaimer, the term of this patent is extended or adjusted under 35 U.S.C. 154(b) by 317 days.

(21) Appl. No.: 13/773,293

(22) Filed: Feb. 21, 2013

(65) Prior Publication Data

US 2014/0230863 A1 Aug. 21, 2014

Related U.S. Application Data

(63) Continuation-in-part of application No. 13/584,280, filed on Aug. 13, 2012, now abandoned.

(51) Int. Cl.
  *B08B 3/02* (2006.01)
  *B41L 41/00* (2006.01)

(52) U.S. Cl.
  CPC ............... *B41L 41/00* (2013.01); *B08B 3/02* (2013.01)

(58) Field of Classification Search
  CPC ........................................................ B41L 41/00
  See application file for complete search history.

(56) References Cited

U.S. PATENT DOCUMENTS

| | | | |
|---|---|---|---|
| 4,196,018 A | 4/1980 | Inoko et al. | |
| 5,047,089 A * | 9/1991 | Grant | B08B 15/026 134/21 |
| 5,366,584 A | 11/1994 | Zukowski et al. | |
| 5,370,762 A | 12/1994 | Zukowski et al. | |
| 5,954,071 A * | 9/1999 | Magliocca | 134/109 |
| 6,537,459 B1 | 3/2003 | Dufresne et al. | |
| RE38,114 E | 5/2003 | Souders et al. | |

* cited by examiner

*Primary Examiner* — Jason Ko
(74) *Attorney, Agent, or Firm* — Stetina Brunda Garred & Brucker

(57) ABSTRACT

Provided is an automatic film washout device includes a housing defining a rinsing chamber and a drain in fluid communication with the rinsing chamber. A drum is rotatably coupled to the housing and is configured to be engageable with the photosensitive material for washout thereof. A booster pump is operatively coupled to the housing and includes a pump inlet and a pump outlet, the pump inlet being fluidly connectable to the pressurized fluid source to receive fluid therefrom at an inlet pressure, the pump being configured to elevate the pressure of the fluid exiting the pump via the pump outlet. A plurality of nozzles are coupled to the housing and in fluid communication with the pump to receive fluid therefrom. The plurality of nozzles are configured to direct fluid into the rinsing chamber for washout of the photosensitive material.

21 Claims, 6 Drawing Sheets

AUTOMATIC FILM WASHOUT SYSTEM

CROSS-REFERENCE TO RELATED APPLICATIONS

This application is a continuation-in-part of U.S. application Ser. No. 13/584,280, filed Aug. 13, 2012, the contents of which are expressly incorporated herein by reference.

STATEMENT RE: FEDERALLY SPONSORED RESEARCH/DEVELOPMENT

Not Applicable

BACKGROUND OF THE INVENTION

Technical Field of the Invention

The present invention relates generally to an automatic film washout system used in forming an etching stencil from a photosensitive material, and more specifically to an automatic film washout system using an unique pressurized water delivery system with a booster pump assembly to greatly reduce water usage using high pressure to replace conventional high water usage of lower pressure systems. This allows the unit to now operate with no on board water storage buffer storage tank used to supply washout cycle water at a higher rate than inlet supply.

Description of the Related Art

Sandblast etching, carving, and engraving highly detailed designs in materials, such as glass, crystal, stone, and metals is well known in the art. In order to produce such highly detailed designs, stencil-like overlays are commonly employed as a tool to facilitate formation of the detailed design within the material. In this regard, when the stencil is laid upon the base material, the stencil may define openings corresponding to the areas of the base material that are to be etched or carved, and cover the areas of the base material that are not intended to be etched or carved.

The stencils are typically formed from a sheet of photosensitive material that is exposed to light corresponding to the design or pattern that is to be etched or carved into the base material. After exposure to the light, the photosensitive material is developed, and uncured emulsion is removed from the stencil to define the openings in the stencil.

The uncured emulsion may be removed from the stencil through a rinsing or washout procedure wherein liquid is directed onto the stencil. Several prior art devices have been developed to perform the washout procedure, and typically include a rotating drum upon which the photosensitive material is mounted for rinsing. A water delivery system sprays pressurized water on the stencil for rinsing the emulsion therefrom. The water delivery system typically includes a pump and a plurality of spray nozzles fluidly connected to the pump. The pumps in many conventional washout devices are configured to pump water at 4.3-8.3 gallons per minute, which is typically higher than the flow rate of most municipal water lines. Thus, a water buffer holding tank is required to store enough water to supply enough water so as to satisfy the pumping capacity of such pumps.

The holding tank is relatively large and typically includes a heating element to heat the water within the holding tank to a preferred rinsing temperature. The holding tank is generally open to the atmosphere, and thus, washout units having such open-to-atmosphere tanks will be referred to herein as "open-to-the-atmosphere" units.

Although such open-to-the-atmosphere units may effectively remove the emulsion from the stencil, they suffer from several deficiencies. One significant drawback to open-to-the-atmosphere units is that they operate at a lower pressure than this new design. While the pump increases the pressure of the water before the water is sprayed onto the stencil, the pressure of the water immediately upstream of the pump is approximately equal to atmospheric pressure (since the holding tank is open-to-the-atmosphere). Thus, the pressure increase created by the pump is inhibited by the low pressure of the water in the holding tank. In order to compensate for the low operating pressure, the conventional washout devices typically operate at a high flow rate of water. This significant increase in water, normally more than inlet supply, requires water storage on board the unit. The new design using the enclosed booster pump with pressurized design cleans faster with higher pressure using less water and does not require any on board water storage supply. Older open to atmosphere units using lower washout pressure require much higher water usage and still produced longer washout times. This longer washout time using increased water amounts can damage film with a wide range of film detail ranging from bold open areas to fine detailed lines on the same part. The new design using low water flow, less time and higher pressure helps to eliminate this washout damage.

Other drawbacks associated with the open-to-atmosphere units includes poor insulation coverage, which results in the loss of heat from water in the holding tank. Furthermore, the tanks generally lack provisions for protecting against tank overflow or spillage.

Another deficiency commonly associated with many conventional non-automatic washout systems is that they are manually operated. In this regard, such manually operated systems typically require that an operator remains with the system during washout operations, i.e., the operator cannot walk away from the system during washout. The labor costs associated with manual operation of conventional washout systems tends to increase the overall cost of the washout procedures. Furthermore, manual operation tends to also include inherent human error.

Therefore, there is a need in the art for an improved automatic washout system that allows for higher water pressure and less water usage during the washout of a stencil to help lesson damage to the film with film over and under washout. Various aspects of the present invention address these particular needs, as will be discussed in more detail below.

BRIEF SUMMARY OF THE INVENTION

The present invention specifically addresses and alleviates the above-identified deficiencies in the art. Along these lines, there is provided a film washout device specifically configured and adapted to include an enclosed, pressurized fluid system that results in high pressure rinsing, while using less water than conventional film washout devices. Various aspects of the present invention are directed toward providing high water pressure, wherein the water pressure is approximately equal to a combination of the water pressure from the pressurized water source (i.e., a municipal water line) and the booster pump pressure for increased performance and much higher washout pressures than conventional open-to-atmosphere units. The high pressure may additionally allow for a wider fan jet. Wider fan jets typically have less impact on the part; however, the higher pump pressure achievable with the enclosed design allows the user of a wider fan jet pattern and also wider jet spacing with greater fan jet distance to the part. As a result, the amount of water used may be greatly reduced. Less water with higher pressure and lower washout time allows for a wider degree of film detail without film over and under washout on the same sample.

The unique, enclosed design which incorporates the booster pump with much higher washout pressure allows for faster film washout, reduced fan jet numbers, wider fan jet spray pattern, and increased fan jet spacing. All of these features greatly reduce the water usage and the cost of heating the water used during film washout. These benefits result from the enclosed, highly pressurized design with the booster pump, adding supply water pressure to high stage booster pump technology. Water only preferably flows during the actual washout cycle, unlike conventional open to the atmosphere units which utilize a large buffer holding tank to receive and store water when the unit is standing idle. The holding tank is needed in older designs because the old technology uses lower pressure with high water volume and typically requires accumulation of water during non-cycle to make up for the large volume used during the washout cycle. This over saturation of water can often damage film with a high degree of difference for film detail on a single washout.

According to one embodiment, the film washout device includes a housing defining a rinsing chamber and a drain in fluid communication with the rinsing chamber. A drum is rotatably coupled to the housing and is configured to be engageable with the photosensitive material for washout thereof. A booster pump is operatively coupled to the housing and includes a pump inlet and a pump outlet, wherein the pump inlet is fluidly connectable to the pressurized fluid source to receive fluid therefrom at an inlet pressure. The pump is configured to elevate the pressure of the fluid exiting the pump via the pump outlet. A plurality of nozzles are coupled to the housing and in fluid communication with the pump to receive fluid therefrom. The plurality of nozzles are configured to direct fluid into the rinsing chamber for washout of the photosensitive material.

The film washout device may include an enclosed fluid flowpath having an inlet connectable to the pressurized fluid source and an outlet defined by the plurality of nozzles, wherein the fluid flowpath is configured to maintain fluid pressure elevated above atmospheric pressure.

The enclosed fluid flowpath may be fluidly isolated from the ambient environment between the inlet and the outlet. The enclosed fluid flowpath may include the booster pump and the plurality of nozzles.

The film washout device may include a hood pivotally coupled to the housing to selectively open and close the rinsing chamber. A light bar, preferably an LED light bar, may also be coupled to the housing and configured to selectively illuminate the rinsing chamber.

The housing may include a catch-tray disposed about the rinsing chamber, wherein the catch-tray includes a plurality of drain holes in fluid communication with the drain.

The film washout device may include a heater in fluid communication with the plurality of nozzles. The heater may be configured to increase the temperature of the fluid emitted by the plurality of nozzles.

The film washout device may additionally include a balance tank which may be insulated and may be configured to prevent or mitigate humidity loss to the atmosphere so as to help in controlling the room humidity and to eliminate open to atmosphere tank overflows. The balance tank may be used to permit intermittent machine use only without water loss caused by open to atmosphere tanks that would lose temperature during non-use.

In addition to the foregoing, there is also provided a film washout device for use with a photosensitive material and a pressurized fluid source capable of delivering a rinsing fluid at a first pressure above atmospheric pressure. The film washout device includes a housing defining a rinsing chamber, and a drum rotatably coupled to the housing and configured to be engageable with the photosensitive material. The film washout device further includes an enclosed fluid system coupled to the housing and fluidly connectable to the pressurized fluid source to receive the rinsing fluid therefrom at a second pressure. The enclosed fluid system defines a fluid flowpath fluidly isolated from the ambient environment, wherein the fluid system is configured to dispense the rinsing fluid in the rinsing chamber at the first pressure, which is higher than the second pressure, for washout of the photosensitive material.

The present invention is best understood by reference to the following detailed description when read in conjunction with the accompanying drawings.

BRIEF DESCRIPTION OF THE DRAWINGS

These as well as other features of the present invention will become more apparent upon reference to the drawings wherein.

Common reference numerals are used throughout the drawings and detailed description to indicate like elements.

DETAILED DESCRIPTION OF THE INVENTION

Figure 1:
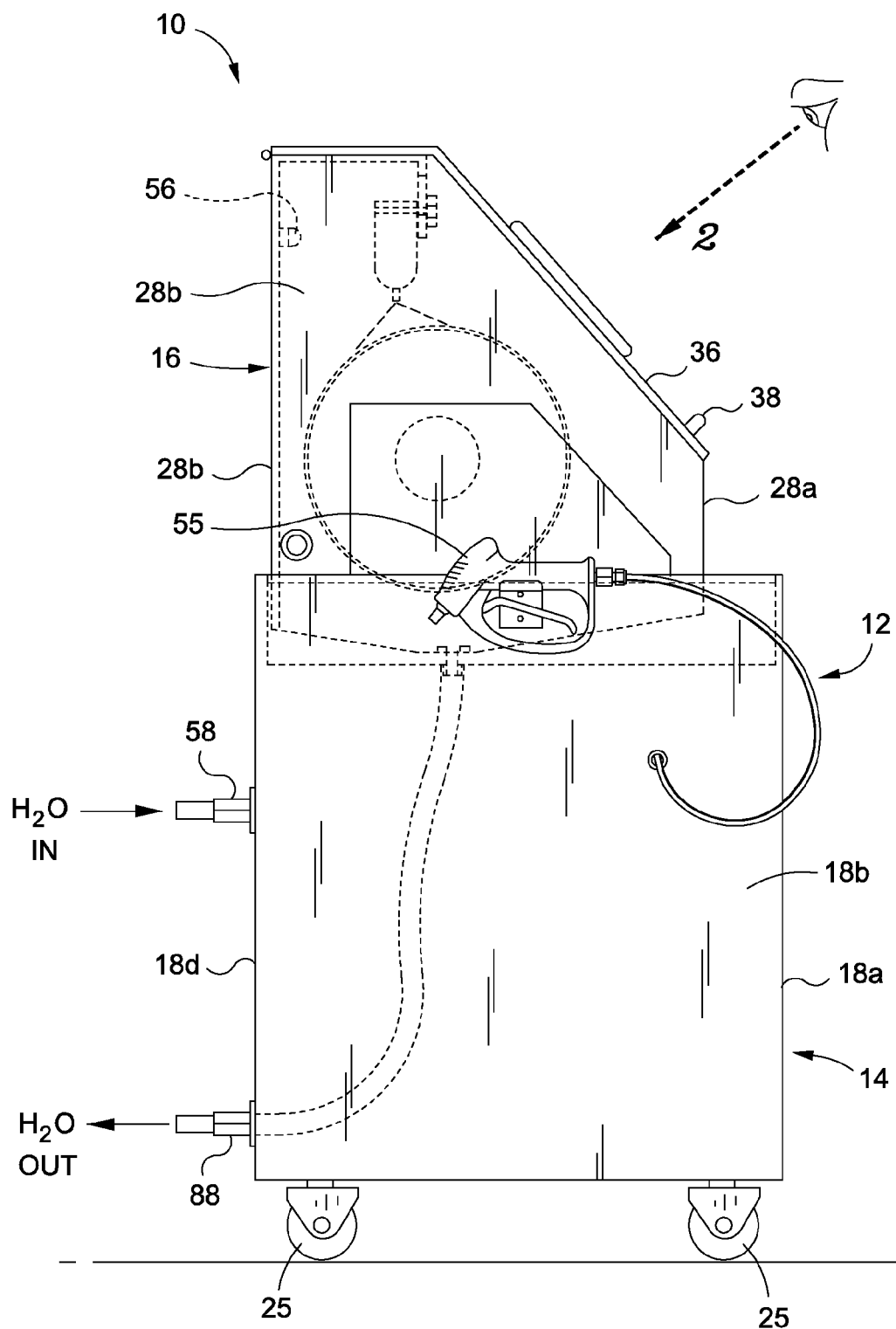
FIG. 1 is a side view of a film washout device constructed in accordance with an embodiment of the present invention.

The detailed description set forth below is intended as a description of the presently preferred embodiment of the invention, and is not intended to represent the only form in which the present invention may be constructed or utilized. The description sets forth the functions and sequences of steps for constructing and operating the invention. It is to be understood, however, that the same or equivalent functions and sequences may be accomplished by different embodiments and that they are also intended to be encompassed within the scope of the invention.

Referring now to the drawings, wherein the showings are for purposes of illustrating a preferred embodiment of the present invention only, and not for purposes of limiting the same, there is shown a film washout device 10 for use with a photosensitive material used to fabricate a stencil for etching glass, crystal, stone, metals, and the like. The film washout device 10 includes an enclosed water system that is not open to the atmosphere. In this regard, the enclosed water system allows water to be delivered at a pressure that is essentially a combination of the supplied water pressure (i.e., the water pressure from a municipal water line) and the amplified pressure from a booster pump for increased performance and much higher washout pressure than conventional open-to-atmosphere units. The high pressure allows low water usage with wide, low flow fan jets. The low water volume and high water pressure associated with various aspects of the film washout device 10 allows the device 10 to use much less water, allowing tank-less operation, or alternatively, use of a very small tank. For instance, various embodiments of the film washout device 10 use 50-70% less water than some conventional washout units. The film washout device 10 is also configured to perform the film washout with the same or faster washout times compared to conventional open-to-atmosphere washout units. The low flow and high pressure additionally permits maximum pump performance pressures. Along these lines, supply pumps typically operate in accordance with a performance curve, wherein the pressure reduces as volume increases. The low flow design of the present invention maximizes the pump outlet pressure.

In the exemplary embodiment depicted in the figures, the film washout device 10 includes a housing 12 having a lower housing portion 14 and an upper housing portion 16. The lower housing portion 14 includes several lower walls which collectively define a lower enclosure 20 for housing the booster pump 22 and a heater 24, as well as any other components which may be needed. The lower housing portion 14 includes a front wall 18a, a pair of side walls 18b, 18c, and a rear wall 18d. The rear wall 18d may include a door 26 that is pivotally connected to a stationary portion of the rear wall 18d to facilitate access into the lower enclosure 20. The lower housing portion 14 may also be supported by a plurality of casters 25 or wheels to allow for ease transport of the device 10.

The upper housing portion 16 includes several upper walls 28, which collectively define a rinsing chamber 30 for rinsing the photosensitive stencils 32. In particular, the upper housing portion 16 includes a front wall 28a, a pair of side walls 28b, 28c, and a rear wall 28d which define the rinsing chamber 30.

Figure 3:
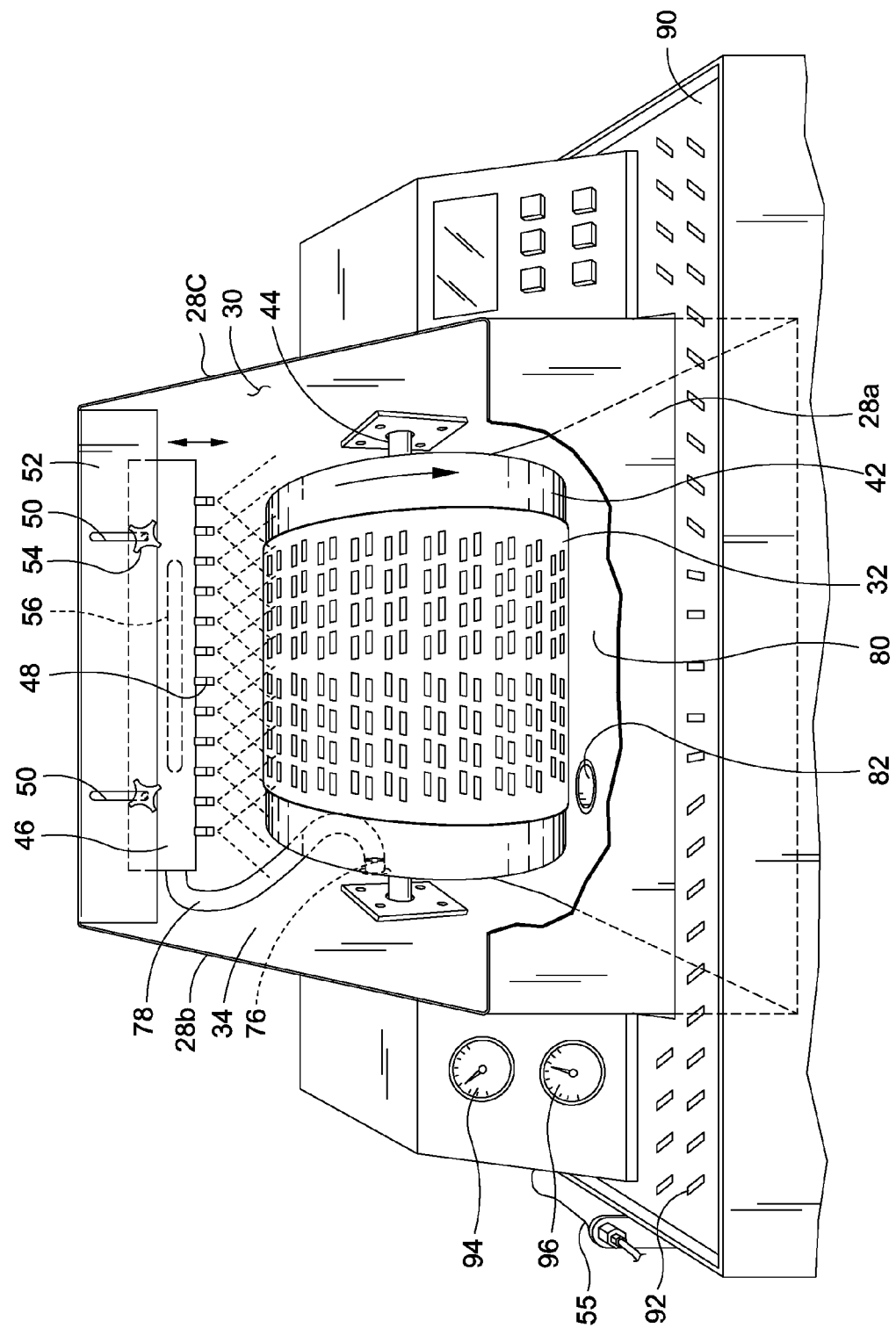
FIG. 3 is a front view of the rinsing chamber, with a stencil coupled to a drum and nozzles emitting rinsing fluid onto the stencil.

As shown in FIG. 3, the upper housing portion 16 is open at an upper end portion thereof to define an upper housing opening 34. The upper housing opening 34 is configured to facilitate entry and removal of the photosensitive stencils 32 into and out of the rinsing chamber 30. In the exemplary embodiment, the upper housing opening 34 is collectively defined by the upper edges of the front wall 28, side walls 28b, 28c, and rear wall 28d.

A hood 36 (See FIG. 2) is pivotally coupled to the upper housing portion 16 to selectively open the rinsing chamber 30. The hood 36 is selectively pivotable between an open position, wherein the upper housing opening 34 is open or exposed to allow for access to the rinsing chamber 30, and a closed position, wherein the upper housing opening 34 is closed to restrict access to the rinsing chamber 30. The hood 36 includes a handle 38 to provide an easily grippable surface to allow the user to move the hood 36 between the closed and open positions.

According to one embodiment, the hood 36 may include a window 40 formed therein for allowing an operator of the washout process to view into the rinsing chamber 30 during the washout process. The window 40 may be centrally located within the hood 36 and positioned to allow an operator standing in front of the device 10 to view the washout process taking place within the rinsing chamber 30. The window 40 may also allow a user to confirm proper nozzle adjustment, as well as viewing of the washout cycle to determine if any nozzles 48 have malfunctioned. Thus, a user may avoid washouts which may not produce a uniform washout, and also save film caused by a washout cycle that is not uniform.

Inside of the rinsing chamber 30, there is a rotating drum 42 upon which a stencil 32 may be secured during the washout process. The drum 42 may have a magnetic surface to allow the stencil 32 to be magnetically connected thereto via a magnetic bar or strip. The drum 42 may also be pre-wet with a manual gun to create surface tension to position the stencil 32 thereon. The drum 42 is sized and configured to rotate freely within the rinsing chamber 30, and thus, defines a diameter which is smaller than the dimensions of the rinsing chamber 30. The drum 42 also defines a length that is shorter than the distance between the two side walls 28b, 28c of the upper housing portion 16 to allow the drum 42 to be spaced from the side walls 28b, 28c.

The drum 42 may be fixed to an axle 44, which in turn, is operatively coupled to a motor, which rotates the axle 44 and the drum 42. The speed and direction of the drum 42 rotation may be selectively varied by controlling the motor. In this regard, the rotation speed of the drum 42 may be selectively increased or decreased by an operator. Furthermore, the drum 42 may selectively rotate in a first direction or an opposing second direction.

Also disposed within the rinsing chamber 30 is a manifold 46 having a plurality of nozzles 48 coupled thereto for spraying water or other rinsing fluid toward the stencil 32 connected to the drum 42. The plurality of nozzles 48 may be in fluid communication with each other via the manifold 46. According to one embodiment, the nozzles 48 are arranged in a linear array along an axis extending generally perpendicular to the side walls 28b, 28c of the upper housing portion 16. The number of nozzles 48, the number of arrays, and the arrangement of nozzles 48 may be varied without departing from the spirit and scope of the present invention.

According to one embodiment, the manifold 46 requires less than 4 gallons of water per minute, and in certain ultra-low-flow embodiments, the manifold uses less than 3 gallons of water per minute. The number of nozzles, wider nozzle fan spray, the nozzle spacing as well as the very low flow rate are all used with the enclosed pressurized design to create the widest jet spacing and the greatest distance from the drum surface to allow for the fewest number of jets to cover the processing area. The nozzle arrangement along with the high pressure may reduce the overall water usage by 50%-60%. The enclosed design also produces a faster film washout time that can also attribute to overall water reduction. According to several embodiments, the enclosed design produces water savings related to washout times of up to 80%, which is not achievable with conventional, closely spaced, lower pressure, and narrower jets. The low flow also mitigates the concern of having too much water being directed at the part surface. Too much water may prevent washout by flooding the part and preventing high pressure water from contacting the part surface. Therefore, the low flow fan jets reduce the water flow and increase the percentage of water contacting the part surface. This reduced water flow and shorter processing time helps to prevent over and under film washout on the same film with a wide degree of film detail present.

According to one embodiment, the nozzles 48 are configured to deliver water to define a jet pattern of 70-110 degrees, which allows for wider placement of the nozzles 48, resulting in fewer nozzles 48 than conventional washout units.

The manifold 46 may be adjustably connected to the upper housing portion 16 to allow for selective positioning of the manifold 46 relative to the drum 42. It may be desirable to adjust the distance between the nozzles 48 and the stencil 32 positioned on the drum 42 to modify the rinsing effect of the water emitted by the nozzles 48. Since the jet pattern created by the nozzles 48 is adjustable, it is also preferable to be able to adjust the distance from the nozzle tip to the surface of the stencil 32 to achieve the exact fan pattern overlap required to create uniform washout during drum rotation. Along these lines, the manifold 46 may be moved away from the drum 42 to define a larger rinsing area, or conversely, moved closed to the drum 42 to define a more narrow rinsing area. Furthermore, the pressure of the water on the stencil 32 may be increased by moving the manifold 46 closer to the drum 42, or conversely, reduced by moving the manifold away from the drum 42.

The adjustment of the manifold 46 relative to the upper housing portion 16 may be facilitated via one or more slots 50 formed within the upper housing portion 16. In the exemplary embodiment, the upper housing portion 16 includes an attachment tab 52 coupled to the rear wall 28*d* and extending into the rinsing chamber 30. The manifold 46 may include one or more attachment rods which extend through a respective one of the slots 50 formed within the attachment tab 52. In this regard, the manifold 46 may translate within the slots 50 to selectively position the manifold 46 relative to the upper housing portion 16. A securing device 54 may be connected to a respective attachment rod to secure the attachment rod in place relative to the upper housing portion 16. In the exemplary embodiment, the securing device 54 includes a rotatable nut that is threadably engaged to a threaded end portion of one of the attachment rods. The securing device 54 is rotated about the attachment rod to securely fasten the manifold 46 in the desired position relative to the upper housing portion 16.

A LED light bar 56 may be coupled to the upper housing portion 16 to emit light into the rinsing chamber 30 for purposes of illuminating the rinsing process taking place within the chamber 30. The LED light bar 56 includes an array of LEDs (i.e., light emitting devices) suitable for illuminating the rinsing chamber 30. In this regard, the LEDs are preferably water proof and configured for wet applications. In the exemplary embodiment, the light bar 56 is positioned behind the manifold 46 (i.e., such that the manifold 46 is positioned between the window 40 and the light bar 56), although the light bar 56 may be positioned at other locations of the rinsing chamber 30 without departing from the spirit and scope of the present invention.

The device 10 may additionally include a hand wand 55 for spraying the rinsing chamber 30, such as before or after a rinsing procedure. An extension hose 65 receives water from a water source and directs the water to the hand wand 55. The hand wand includes a trigger 57, which when actuated by the user, causes water to flow from the hand wand 55 when the hand wand 55 is connected to a water source. Unlike the open to atmosphere units, the new enclosed pressurized unit design does not require a secondary pump to operate the hand wand 55 like older unit operating open to atmosphere.

Figure 4:
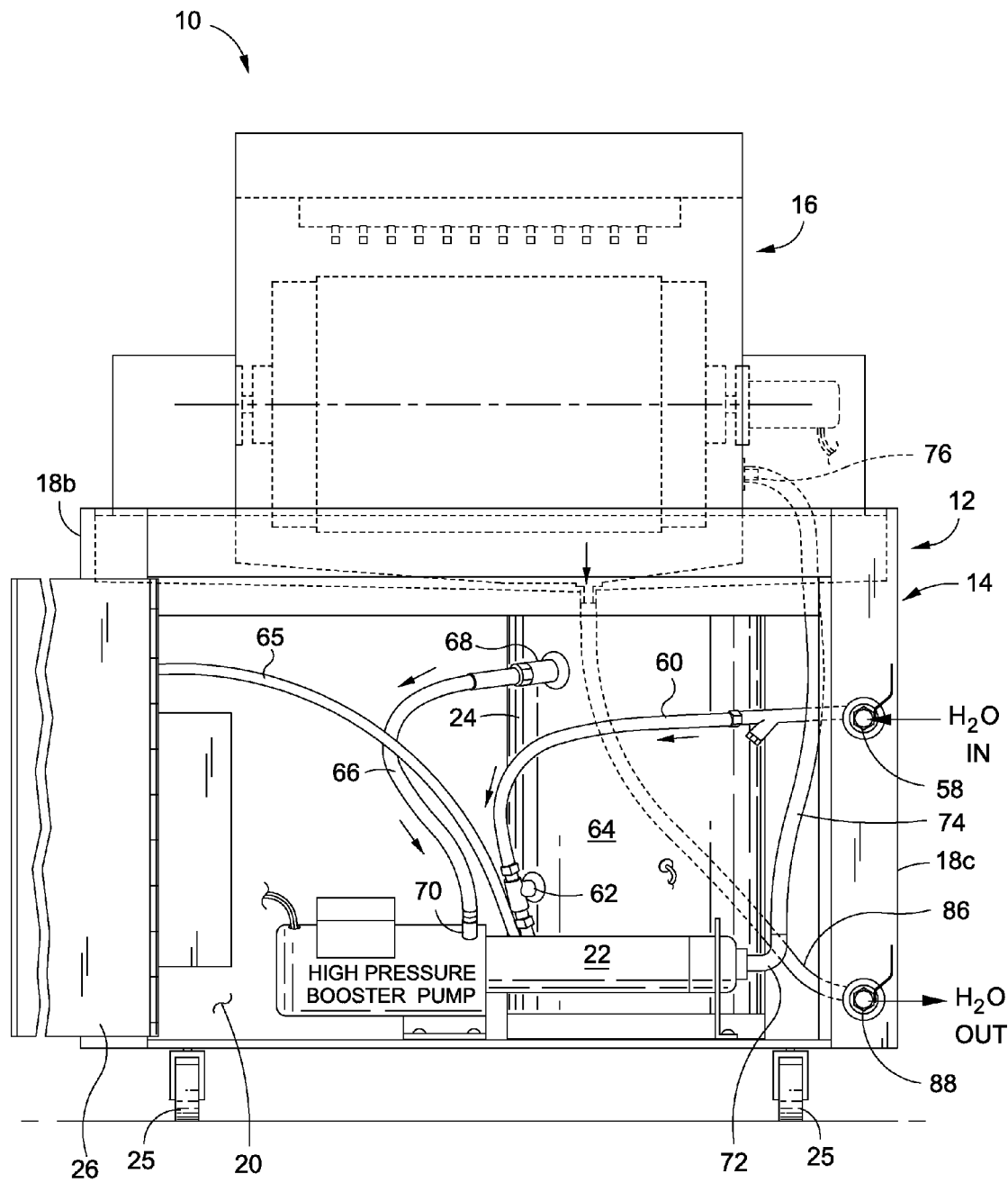
FIG. 4 is a rear view of a lower enclosure having a booster pump and a water heater.

With the basic structural features of the device 10 being described above, the fluid flow through the device 10 will now be described. Fluid enters the device 10 from a pressurized fluid source, such as a municipal water line, or the like, at a first water pressure. Along these lines, it is contemplated that the device 10 may operate with low fluid supply rates, in some cases as low as 2.9 gallons per minute, while other embodiments may operate at a flow rate of 4.0 gallons per minute. The device 10 includes a fluid inlet 58 which is fluidly connectable to the pressurized fluid source. For instance, a hose (not shown) delivering water from the municipal water line may be connected to the fluid inlet 58 to deliver pressurized fluid to the device 10. Preferably, the incoming water supply temperature is 90-120 degrees Fahrenheit. Referring now specifically to FIG. 4, which shows the lower enclosure 20, the fluid inlet 58 is fluidly connected to a first hose 60 disposed within the lower enclosure 20, wherein the first hose 60 extends between the fluid inlet 58 and an inlet 62 to an internal water heater 64 to deliver fluid from the fluid inlet 58 to the water heater 64. The extension hose 65 is additionally shown in FIG. 4 and receives water from the first hose 60 (either through a manifold, or indirectly from the water heater 64) and delivers the water to the hand wand 65.

A second hose 66 extends between an outlet 68 formed on the water heater 64 and an inlet 70 on the booster pump 22 to deliver heated water to the booster pump 22. The internal water heater 64 is optional and may be removed from the device 10 without departing from the spirit and scope of the present invention. In this regard, various implementations of the present invention may operate independent of a water heater, or may include a tank-less water heating system, wherein water would be heated in-line between the fluid inlet 58 and the booster pump 22. Furthermore, in embodiments which do not include a water heater 64, the first hose 60 may extend from the fluid inlet 58 directly to the booster pump 22. If a water heater 64 is employed, it is preferred that it is not open to the ambient environment so as to preserve the water pressure received from the pressurized water source.

A blending water valve may be used to reduce the demand for hot water supply. The low water requirements of the enclosed system allow the water blending valve to be connected with cold and hot water supply. The heated water is blended with the cold water to reduce the amount of hot water required for film washout. A combination of economical heated water mixed with cold water allows reduced cost for hot water needed to operate the system.

The pressure of the water entering the booster pump 22 is at a first pressure, which is preferably above atmospheric pressure. The first pressure is substantially equal to the pressure of the water supplied from the pressurized water source. The booster pump 22 is configured to further increase the pressure of the water to a second pressure, which is higher than the first pressure. The enclosed pressurized low flow of the system additionally allows for maximum pump outlet pressure to operate at maximum pump outlet performance.

According to one embodiment, the booster pump 22 is not a vacuum pump, and thus, the washout operation stops water delivery when demand exceeds supply. An optional alarm may be installed to indicate low water washout pressure. The booster pump 22 mitigates dry pump operation, which tends to occur when a large buffer tank in a conventional system runs dry.

The water exists the booster pump 22 via an outlet 72 and enters a third hose 74, which extends from the outlet 72 to an upper housing inlet 76 coupled to the upper housing 16. According to one embodiment, under preferred operating conditions, the enclosed design requires more water flow supply than water usage to maintain operation. When the supply does not meet the demand, the washout pressure will fall and stop delivering water for washout to protect against dry pump operation.

In tank-less embodiments, the device 10 may include an anti-hammer shock absorber valve, preferably installed at the intake end of the pump 22 before a master ON/OFF solenoid, to prevent free flow of water through the pump 22.

Referring now specifically to FIG. 3, the upper housing inlet 76 is fluidly connected to a fourth hose 78, which fluidly connects the upper housing inlet 76 and the manifold 46. Thus, water may be delivered from the upper housing inlet 76 to the manifold 46 via the fourth hose 78. The water then passes through the manifold 46, and exists via the nozzles 48 where the water is directed toward the stencil 32 positioned on the drum 42.

Figure 5:
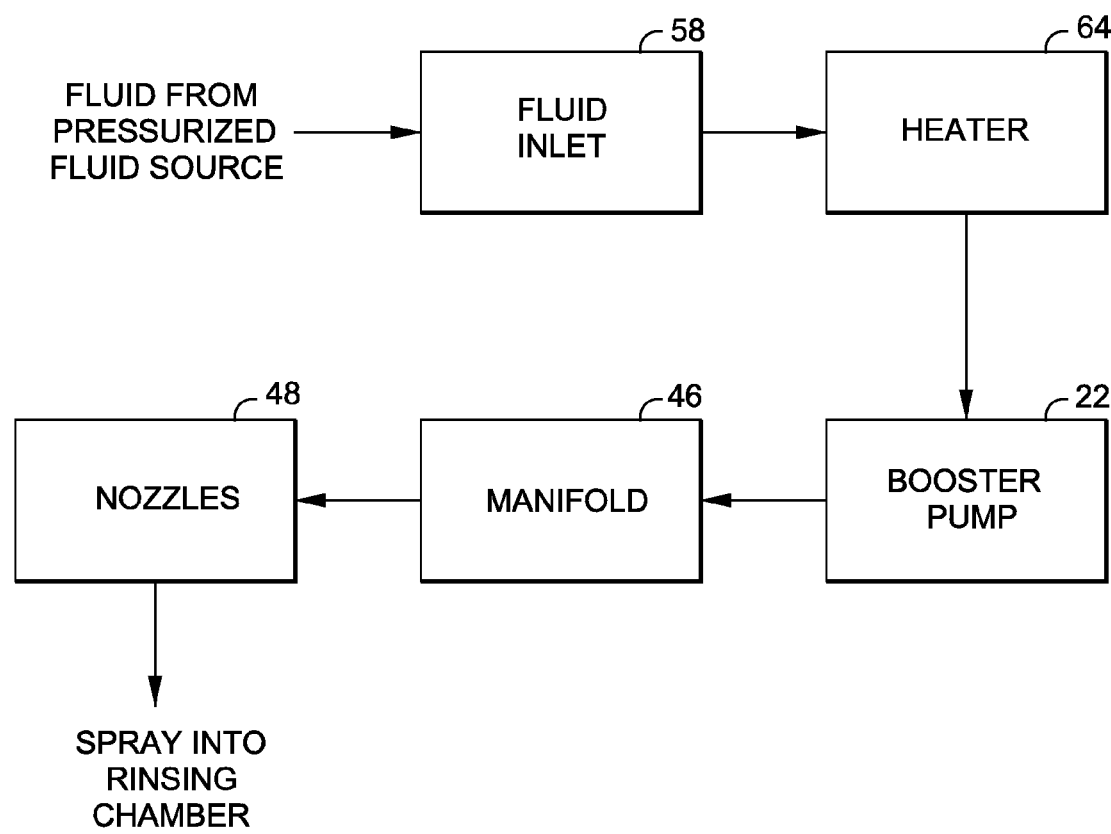
FIG. 5 is a flow chart showing fluid flow through an enclosed fluid flowpath incorporated into the film washout device.

The flowpath described above which extends from the fluid inlet 58 to the nozzles 48 is referred to herein as the "inlet flowpath" and is depicted in a flowchart in FIG. 5. As described above, the inlet flowpath is an enclosed fluid flowpath that is fluidly isolated from the ambient environment. In this regard, pressure within the inlet flowpath is preserved to allow pressure to increase from the first pressure to the second pressure as the fluid flows through the inlet flowpath. As such, the enclosed inlet flowpath yields a much higher washout pressure, which in turn allows for low water usage and wider flow fan jets from the water exiting the nozzles 48 when compared to conventional washout systems including a holding tank open to the atmosphere. The pressure from the open-to-the-atmosphere systems is much lower due to the lower pressure of the water entering the system. In particular, the starting pressure in the open-to-the-atmosphere systems is approximately equal to atmospheric pressure, which is typically lower than the first pressure of the water entering the present device 10.

According to various implementations, the enclosed pressure design and resultant high water pressure allows the device 10 to perform washouts while utilizing up to 70% less water than units with open water storage tanks. Consequently, less water is discharged from the device 10 to the sewer, and thus, the device 10 is an ecologically superior alternative to conventional washout devices. Furthermore, standard washout pressures typically operate within a range of approximately 100-130 psi, while the pressure achieved with the enclosed pressurized system of the device 10 permits washout pressures in the range of 250-270 psi. The high pressure also allows a wider fan spray, which utilizes less water to washout film at the same rate or faster rates than conventional washout units. The wide fan jet allows for wider spacing of the nozzles 48. The enclosed system further mitigates tank overflow, and reduces heat and humidity loss, which are common detriments to conventional open-to-atmosphere units. Using less water with higher washout pressures allows a wider range of film detail washout on the same film sheet without over and under washout.

After the water is sprayed from the nozzles 48 toward the drum 42, the water falls off of the drum 42 or stencil 32 onto the bottom wall 80 of the upper housing portion 16. The bottom wall 80 includes a drain opening 82 to allow water which falls onto the bottom wall 80 to drain through the drain opening 82. In this regard, the bottom wall 80 may be angled toward the drain opening 82 to cause the water on the bottom wall 80 to flow toward the drain opening 82. The drain opening 82 empties into a catch tray 84 mounted within upper housing portion 16. The catch tray 84 is fluidly connected to a fifth hose 86 which delivers the drained fluid to a fluid outlet 88 mounted on the housing 12.

It is understood that water may drip from the stencil 32 as it is removed from the rinsing chamber 30. Therefore, one embodiment of the device 10 includes an upper catch surface 90 disposed about the upper housing portion 16 to catch water dripping from the stencil 32, or perhaps water which may inadvertently spill from the rinsing chamber 30. The upper catch surface 90 includes a plurality of openings 92 which empty into the catch tray 84 and ultimately drains the water through the fluid outlet 88.

Figure 2:
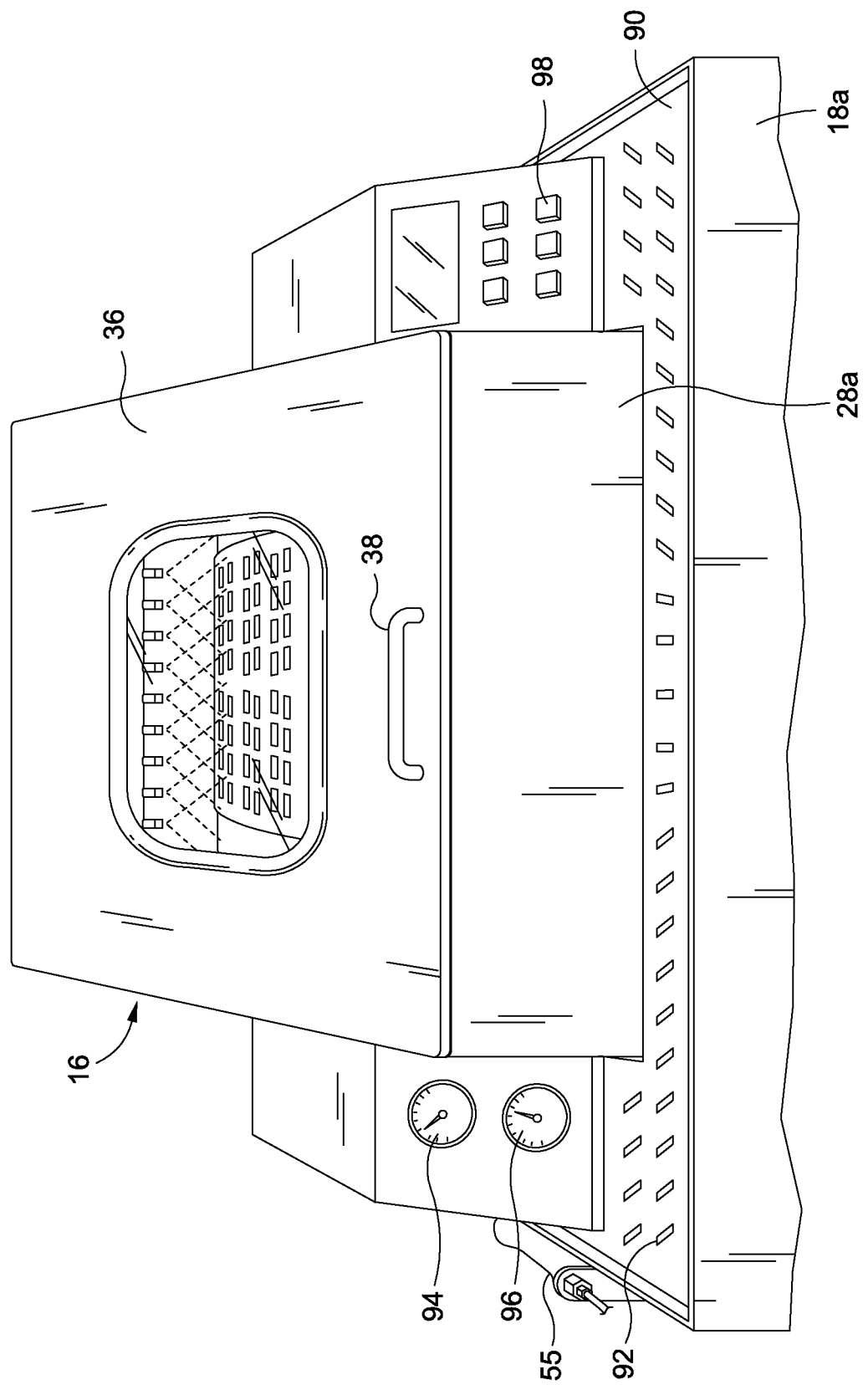
FIG. 2 is a front view of an upper housing portion and a hood in a closed position to enclose a rinsing chamber.

The operation of the device 10 may be controlled via a control panel and user interface mounted to the housing 12. Referring now specifically to FIGS. 2 and 3, the control panel and user interface includes a plurality of gauges disposed on one side of the upper housing portion 16 and several control inputs and a display screen on the other side of the upper housing portion 16. The gauges may include a temperature gauge 94 and a pressure gauge 96 for displaying the temperature and pressure, respectively, of the water sprayed into the rinsing chamber 30. The temperature and pressure gauges 94, 96 are operatively coupled to respective temperature and pressure sensors mounted within the fluid flowpath to take readings of the temperature and pressure of the water. Although the exemplary embodiment shows temperature and pressure gauges 94, 96, other gauges may be included in the control panel and user interface, such as gauges depicting the flow rate, inlet pressure, rinsing time, etc.

The control inputs 98 may allow the user to selectively control the start and stop of the washout procedure. Along these lines, one input may include an ON button, while another input includes an OFF button/Emergency shut-off. An ON/OFF button for the LED lights may also be included in the control inputs 98. The inputs 98 may also allow the user to selectively increase or decrease the speed of the drum rotation, as well as the direction of drum rotation. The inputs 98 may also include a cycle timer to allow a user to selectively control the cycle time of the rinsing procedure.

The inputs 98 may also include a manual rinse button, which when pressed, manually actuates the manifold to allow for user control of fluid output. For instance, it may be desirable to pre-wet the drum 42 before a stencil 32 is applied thereto. Therefore, the manual rinse button may allow for such pre-wetting of the drum 42. The drum 42 may also be configured to rotate when the manual rinse button is actuated.

Figure 6:
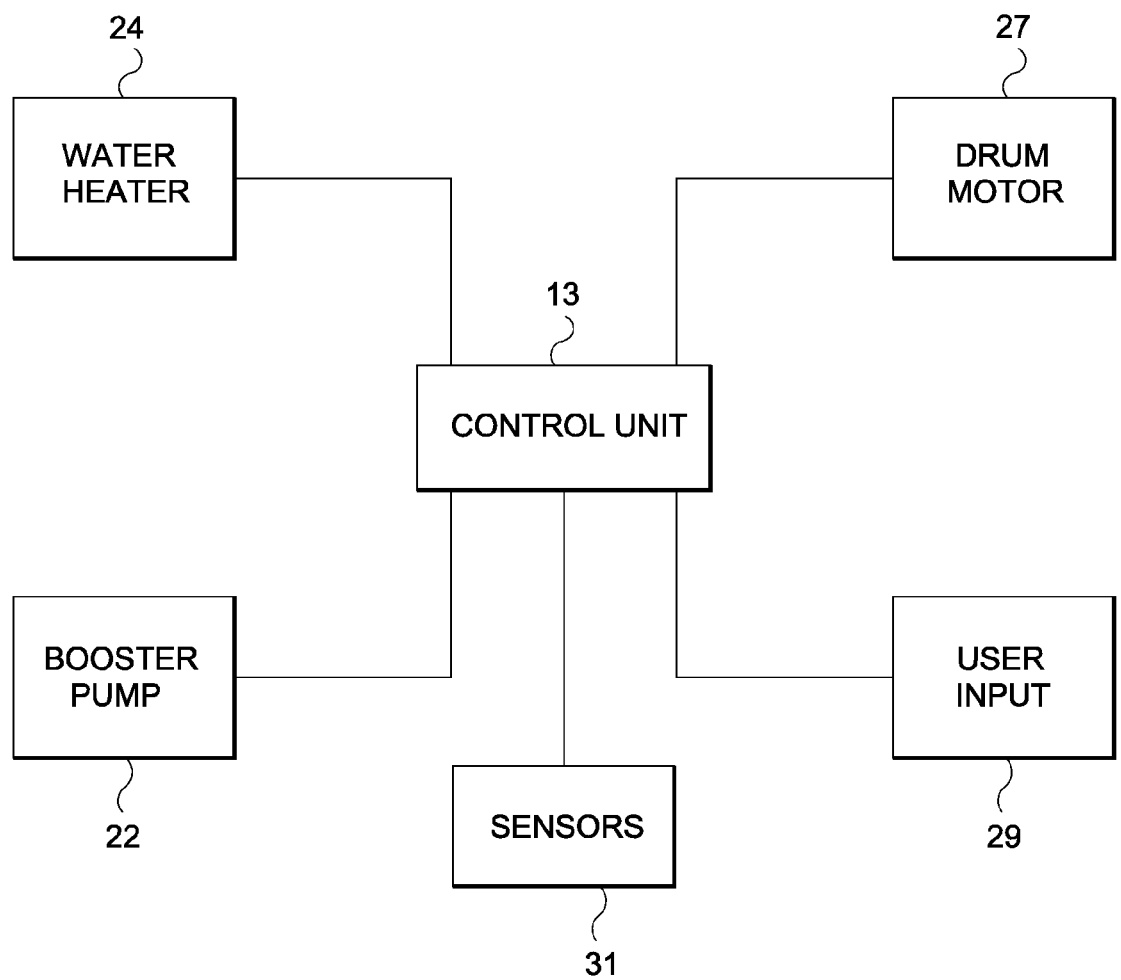
FIG. 6 is a schematic diagram of various electrical components incorporated into one embodiment of the device.

According to one embodiment, the device 10 may be programmed to perform the washout automatically to avoid the need for continuous manual operation. Along these lines, the device 10 may include a control unit 13 (see FIG. 6 in operative communication with several of the components incorporated into the device 10, including but not limited to the booster pump 22, water heater 24, drum motor 27, a user input 29, and one or more sensors 31 (i.e., pressure, temperature, flow rate, time, etc). The control unit 13 may be preprogrammed to automatically perform one or more washout operations by controlling the various components of the device 10. In one embodiment, operation of the device 10 is as simple is placing the stencil 32 on the drum 42, closing the hood 36, and actuating a START button, which is in operative communication with the control unit. Once the control unit 13 receives the initiation signal from the START button (i.e., the user input 29), the control unit 13 communicates operational signals to the various components (i.e., the booster pump 22, drum motor, etc.) to automatically operate the device 10 without any input from an operator once the washout process has begun. When the washout process has been completed according to a pre-programmed operation schedule, the control unit 13 communicates a "stop" signal to conclude operations, at which point the user may open the hood 36 and retrieve the stencil 32.

The automatic operation of the device 10 may significantly reduce the overall cost of completing the part. In particular, the labor costs may be significantly reduced since minimal operator involvement is required and the enclosed pressurized design tends to have a higher washout pressure which reduces washout time.

Operation of the device 10 may also be automatically associated with the position of hood 36 so as to ensure safety of the operator. Along these lines, the device 10 may be configured to operate when the hood 36 is in the closed position only. If the hood 36 is raised when the device 10 is ON, an automatic kill-signal may be initiated to immediate terminate further operation. When the operation is terminated, the water may immediate stop flowing from the nozzles 48 and the drum 42 may stop rotating.

According to one embodiment, the device 10 may include manual jog with washout allowing the operator to add additional time to an ended washout cycle. The device 10 may further include a manual jog only cycle to spin dry the film helping to stop the water washout development of the film. The spinning may remove 95% of the surface tension water remaining on the film after the cycle ends.

Due to the low flow rate/water usage required during the film washout process of the present invention, the various hoses utilized within the device 10 may have an inner diameter of approximately ½", although other sizes may be used without departing from the spirit and scope of the present invention.

Furthermore, although the foregoing discusses a film washout process wherein water is the rinsing fluid, those skilled in the art will readily appreciate that other rinsing fluids may be used.

Additional modifications and improvements of the present invention may also be apparent to those of ordinary skill in the art. Thus, the particular combination of components and steps described and illustrated herein is intended to represent only certain embodiments of the present invention, and is not intended to serve as limitations of alternative devices and methods within the spirit and scope of the invention.

What is claimed is:

1. A film washout device for use with an external pressurized fluid source and a photosensitive material, the film washout device comprising:
   a housing having a rinsing chamber, a drain in fluid communication with the rinsing chamber, and a housing outlet in fluid communication with the drain, such that fluid flows out of the rinsing chamber, through the drain, and through the housing outlet to exit the housing;
   a drum rotatably coupled to the housing and configured to be engageable with the photosensitive material for washout thereof;
   a first fluid flowpath having a first inlet and a first outlet, the first inlet being fluidly connectable to the external pressurized fluid source to receive pressurized fluid therefrom, the first fluid flowpath being adapted to maintain pressure of the pressurized fluid above atmospheric pressure as the fluid flows from the first inlet to the first outlet;
   a booster pump operatively coupled to the housing and including a pump inlet and a pump outlet, the pump inlet being fluidly connected to the first outlet to receive fluid from the first fluid flowpath, the pump being configured to elevate the pressure of the fluid exiting the pump via the pump outlet;
   a control unit in operative communication with the booster pump and drum to control fluid flow through the booster pump and rotation of the drum; and
   a plurality of nozzles coupled to the housing and in fluid communication with the pump to receive fluid therefrom, the plurality of nozzles being configured to direct fluid into the rinsing chamber for washout of the photosensitive material;
   the device defining a serial flowpath from the first inlet to the housing outlet wherein fluid flows sequentially through the first fluid flowpath, the booster pump, the nozzles, the drain and then exits the housing through the housing outlet, without recirculating within the device.

2. The film washout device recited in claim 1, further comprising a hood pivotally coupled to the housing.

3. The film washout device recited in claim 1, further comprising a light bar coupled to the housing and configured to selectively illuminate the rinsing chamber.

4. The film washout device recited in claim 1, wherein the plurality of nozzles are adjustably coupled to the housing.

5. The film washout device recited in claim 1, wherein the housing includes a catch-tray disposed about the rinsing chamber, the catch-tray having a plurality of drain holes in fluid communication with the drain.

6. The film washout device recited in claim 1, further comprising a heater in fluid communication with the plurality of nozzles, the heater being configured to increase the temperature of the fluid emitted by the plurality of nozzles.

7. The film washout device recited in claim 1, further comprising an enclosed fluid flowpath having an inlet connectable to the external pressurized fluid source and an outlet defined by the plurality of nozzles, the fluid flowpath being configured to maintain fluid pressure elevated above atmospheric pressure.

8. The film washout device recited in claim 7, wherein the enclosed fluid flowpath is fluidly isolated from the ambient environment between the inlet and the outlet.

9. The film washout device recited in claim 7, wherein the enclosed fluid flowpath includes the booster pump and the plurality of nozzles.

10. A film washout device for use with a photosensitive material and an external pressurized fluid source capable of delivering a rinsing fluid at a first pressure above atmospheric pressure, the film washout device comprising:
    a housing having a rinsing chamber and a housing outlet;
    a drum rotatably coupled to the housing and configured to be engageable with the photosensitive material;
    an enclosed fluid system coupled to the housing and fluidly connectable to the external pressurized fluid source to receive the rinsing fluid therefrom at a second pressure above atmospheric pressure, the enclosed fluid system defining a fluid flowpath from the external pressurized fluid source to the rinsing chamber that is fluidly isolated from the ambient environment, the fluid system being configured to dispense the rinsing fluid in the rinsing chamber at the first pressure higher than the second pressure for washout of the photosensitive material; and
    a control unit in operative communication with the enclosed fluid system to control fluid flow therethrough;
    the housing outlet and enclosed fluid system being configured to define a serial flow path therein such that fluid exiting the housing outlet is not recirculated within the housing to the enclosed fluid system.

11. The film washout device recited in claim 10, wherein the enclosed fluid system includes:
- a fluid inlet coupled to the housing and fluidly connectable to the external pressurized fluid source to receive the rinsing fluid therefrom at the second pressure;
- a booster pump having a pump inlet and a pump outlet, the pump inlet being fluidly connected to the fluid inlet to receiving the rinsing fluid therefrom, the booster pump being configured to emit the rinsing fluid from the pump outlet at the first pressure; and
- a plurality of nozzles fluidly connected to the pump outlet and configured to spray the rinsing fluid into the rinsing chamber.

12. The film washout device recited in claim 11, wherein the plurality of nozzles are adjustably coupled to the housing.

13. The film washout device recited in claim 10, further comprising a hood pivotally coupled to the housing.

14. The film washout device recited in claim 10, further comprising a light bar coupled to the housing and configured to selectively illuminate the rinsing chamber.

15. The film washout device recited in claim 10, wherein the housing includes a drain and a catch-tray disposed about the rinsing chamber, the catch-tray having a plurality of drain holes in fluid communication with the drain.

16. The film washout device recited in claim 10, wherein the enclosed fluid system includes a heater configured to increase the temperature of the rinsing fluid.

17. A film washout device for use with an external pressurized fluid source and a photosensitive material, the film washout device comprising:
- a housing defining a rinsing chamber and a drain in fluid communication with the rinsing chamber;
- a first fluid flowpath adapted to extend between the external pressurized fluid source and the rinsing chamber, the first fluid flowpath being further adapted to receive fluid from the external pressurized fluid source, the first fluid flowpath being fluidly isolated from the ambient environment and adapted to maintain pressure of fluid flowing therethrough above atmospheric pressure;
- a booster pump operatively coupled to the housing and including a pump inlet and a pump outlet, the pump inlet being fluidly connected to the first fluid flowpath to receive fluid therefrom, the pump being configured to elevate the pressure of the fluid exiting the pump via the pump outlet; and
- a plurality of nozzles coupled to the housing and in fluid communication with the pump to receive fluid therefrom, the plurality of nozzles being configured to direct fluid into the rinsing chamber;
- the device having a serial fluid flow therethrough, wherein fluid flows sequentially through the first fluid flowpath, the booster pump, the plurality of nozzles, the rinsing chamber, and the drain before exiting the device, without recirculating.

18. The film washout device recited in claim 1, wherein the first fluid flowpath is adapted to maintain pressure of the pressurized fluid above atmospheric pressure as fluid flows from the external pressurized fluid source and the booster pump.

19. The film washout device recited in claim 17, further comprising a hood pivotally coupled to the housing.

20. The film washout device recited in claim 17, further comprising a light bar coupled to the housing and configured to selectively illuminate the rinsing chamber.

21. The film washout device recited in claim 1, wherein the fluid washout pressure is between 250-270 psi, and a flow rate of fluid emitted by the plurality of nozzles collectively is less than 4 gallons per minute.

* * * * *